United States Patent [19]

Hernandez et al.

[11] Patent Number: 4,492,918
[45] Date of Patent: Jan. 8, 1985

[54] HIGH VOLTAGE POWER LINE PHASE ANGLE AND CURRENT MEASURING INSTRUMENT

[75] Inventors: E. Norman Hernandez, Seattle; Eric M. Hammerquist, Arlington, both of Wash.

[73] Assignee: Terra Technology Corp., Redmond, Wash.

[21] Appl. No.: 411,378

[22] Filed: Aug. 26, 1982

[51] Int. Cl.$^3$ ............................................. G06F 15/20
[52] U.S. Cl. .................................. 324/83 R; 324/72.5; 324/83 D
[58] Field of Search ................. 324/72.5, 83 R, 83 D, 324/86, 87, 107, 127, 123 R, 128, 149

[56] References Cited

U.S. PATENT DOCUMENTS

| | | | |
|---|---|---|---|
| 3,604,983 | 9/1971 | Levin et al. | 361/95 |
| 3,986,116 | 10/1976 | Smith et al. | 324/127 |
| 4,055,804 | 10/1977 | Mayfield | 324/123 R |
| 4,114,095 | 9/1978 | Pankove et al. | 324/149 |
| 4,158,810 | 6/1979 | Leskovar | 324/127 |
| 4,283,643 | 8/1981 | Levin | 307/309 |
| 4,316,254 | 2/1982 | Levin | 324/72.5 |
| 4,330,778 | 5/1982 | Yamazaki et al. | 324/83 |

Primary Examiner—Stewart J. Levy
Attorney, Agent, or Firm—Christensen, O'Connor, Johnson & Kindness

[57] ABSTRACT

A high voltage power line phase-angle and current measuring instrument suitable for mounting on the end of a power line hot stick is disclosed. The instrument is capacitively and inductively coupled to a single power line conductor whose phase angle and/or current are to be measured. The capacitive and inductive coupling produce voltage and current signals that are processed in voltage and current phase channels. The voltage and current phase channels filter and square the signals in a phase coherent manner, i.e., the phase relationship between the voltage and current signals is maintained as the signals are filtered and squared. The resulting voltage and current square-wave signals are applied to a signal processor. A current conversion channel also receives the current signal, the current conversion channel first converts the alternating current signal to a DC signal whose magnitude represents the RMS value of the alternating current signal, and then converts the RMS signal from analog form to digital form under the control of the signal processor. The digital RMS signal is also applied to the signal processor. The signal processor processes the signals it receives and selectively produces display control signals denoting phase angle, RMS current value and reactive current value. The phase angle is determined by measuring the time between zero crossings of the current and voltage square wave signals and mathematically combining resulting time measurements. The RMS current value is derived from the digital RMS signal; and, the reactive current value is determined by multiplying the RMS current by the phase angle.

33 Claims, 7 Drawing Figures

Fig. 4. RMS CURRENT SUBROUTINE

Fig. 6. REACTIVE CURRENT SUBROUTINE

Fig. 5.

HIGH VOLTAGE POWER LINE PHASE ANGLE AND CURRENT MEASURING INSTRUMENT

TECHNICAL AREA

This invention relates to electrical measuring instruments and, more particularly, to voltage power line measuring instruments.

BACKGROUND OF THE INVENTION

As is well known to persons involved in the electric power industry, power transmission losses are minimized when a zero phase relationship (e.g., a zero phase angle) exists between the current and voltage waveforms of the power being transmitted. In order to achieve this phase relationship capacitors are connected to power lines. In order to determine the amount of capacitance to be added, it is necessary to determine the phase angle between the current and voltage waveforms. In the past, this has been accomplished by installing current and voltage transformers at various locations in the power distribution system. The signals produced across the secondary windings of such transformers are utilized to determine the phase angle. This technique has a number of disadvantages. First, the inclusion of current and voltage transformers is expensive, particularly if phase information is desired at frequent intervals along the transmission line. Not only is the cost of the transformers undesirably high, the installation and maintenance of such transformers is time consuming and, therefore, expensive. Further, the inclusion of such transformers may disturb the operation of the power distribution system in an undesirable manner.

In order to avoid the foregoing disadvantages, attempts have been made to produce portable phase angle meters suitable for use on high voltage power lines. One such approach is described in U.S. Pat. No. 4,316,254 entitled "Portable Phase Angle Meter Instrument" by Harry P. Levin. One of the major disadvantages of portable phase angle meters of the type described in U.S. Pat. No. 4,316,254 is its requirement that a coupling connection be made to two high voltage power line conductors, rather than a single power line conductor. More specifically, the instrument described in U.S. Pat. No. 4,316,254 includes a potential probe for making a coupling connection to a first conductor and a current probe for making a coupling connection to a reference conductor. The instrument produces current and voltage signals that are digitized and processed to generate leading and lagging phase angle signals. The phase angle signals are applied to a suitable display. The probes include hollow tubes of plastic or other nonconductive materials. These power line "hot sticks" support hooks, which are used to hang the probes from the high voltage power line conductors. Obviously, for safety reasons, it is desirable to minimize the number of connections to high voltage power line conductors required to obtain desired measurements. Also, obviously, the minimum number of connections is a single connection. Consequently, a portable phase angle meter of the type described in U.S. Pat. No. 4,316,254 has the disadvantage of requiring more than a minimum number of connections to high voltage power lines.

Therefore, there is a need for a new and improved portable phase angle measuring instrument suitable for use with high voltage power lines. In particular, there is a need for a portable phase angle measuring instrument that only requires a single coupling connection to a high voltage power line conductor.

In addition to phase angle measuring, in many instances, power transmission compound personnel require information about the RMS value of the current flowing through the line and/or the value of the reactive current in the power transmission line. Therefore, it is desirable to provide a high voltage power line measuring instrument that determines such current information as well as phase angle information.

SUMMARY OF THE INVENTION

In accordance with this invention, a high voltage power line phase angle measuring instrument suitable for mounting on the end of a power line hot stick is provided. The instrument is capacitively and inductively coupled to a single power line conductor and the capacitive and inductive couplings produce voltage and current signals. The voltage and current signals are processed in voltage and current phase channels, which filter and square the signals while maintaining the phase relationship therebetween. The square wave signals are processed by a signal processor that measures the time between zero crossings and uses the resultant information to determine the phase relationship (phase angle) between the voltage and current signals. The resultant phase angle information is applied to a suitable display.

In accordance with further aspects of this invention, the high voltage power line phase angle measuring instrument also measures current. Specifically, a current conversion channel receives the current signal, converts the alternating current signal to a DC current signal whose magnitude represents the RMS value of the current and applies the resultant RMS current information to the signal processor. Preferably, the RMS current information is converted from analog form to digital form (under the control of the signal processor) prior to being applied to the signal processor.

In accordance with still further aspects of this invention, in addition to producing phase angle display control signals, the signal processor also produces RMS current display signals and reactive current display signals. The reactive current display signals are produced by multiplying the RMS current value of the value of the sine of the phase angle.

In accordance with yet other aspects of this invention, the signal processor has both a continuous mode of operation and an automatic mode of operation. In the continuous mode of operation, the signal processor is manually adjustable to display a selected one of the phase angle, RMS current and reactive current measurement values. In the automatic mode of operation, the signal processor sequentially displays the three measurement values on a predetermined time interval (e.g., three second) basis.

As will be readily appreciated from the foregoing description, the invention provides an instrument suitable for measuring power line phase angle and/or current values. Because it is usable on the end of a power line "hot stick", the invention can be readily attached to and detached from a power line conductor. Thus, the disadvantages of permanently attached measuring instruments are avoided. Further, because attachment to only a single power line conductor is required, rather than attachment to a plurality of conductors, power line connection danger is minimized.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENT

Figure 1:
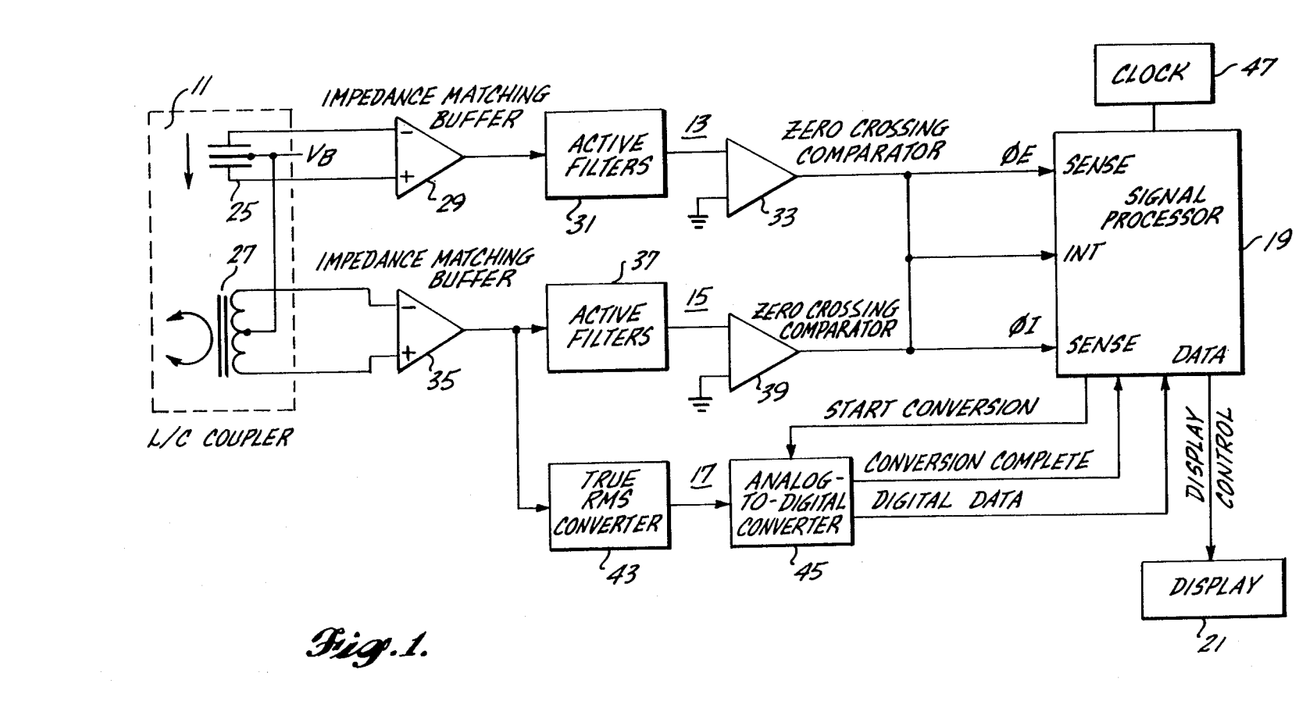
FIG. 1 is a block diagram of a high voltage power line phase angle and current measuring instrument formed in accordance with the invention.

FIG. 1 illustrates a high voltage power line current and phase angle measuring instrument formed in accordance with the invention and comprises: an inductive (L)/capacitive (C) coupler 11; a voltage phase channel 13; a current phase channel 15; a current conversion channel 17; a single processor 19; and, a display 21. The L/C coupler 11 includes: a center tapped coupling capacitor 25; and, a center tapped coupling inductor 27. The voltage channel 13 includes: an impedance matching buffer 29; active filters 31; and, a zero crossing comparator 33. The current channel 15 includes: an impedence matching buffer 35; active filter 37; and, a zero crossing comparator 39. The current conversion channel 17 includes: a true RMS converter 43; and, an analog-to-digital converter 45. Clock signals required by the signal processor 19 are produced by a clock 47.

A positive voltage source designated $V_B$ is connected to the center terminals of the coupling capacitor 25 and the coupling inductor 27. The outer plates of the coupling capacitor 25 are connected to the inverting and noninverting inputs of the inpedence matching buffer 29 and the output of the impedance matching buffer 29 is connected to the input of the active filters 31 of the voltage phase channel 13. The output of the active filters 31 of the voltage phase channel 13 is connected to one input of the zero crossing comparator 33 of the voltage phase channel. The other input of the zero crossing comparator 33 of the voltage phase channel is connected to ground. The output of the zero crossing comparator, denoted $\phi E$, is connected both to a sense input of the signal processors 19 and to the interrupt input of the signal processor.

The outer ends of the winding of the coupling inductor 27 are connected to the inverting and noninverting inputs of the impedance matching buffer 35 of the current phase channel 15. The output of the impedance matching buffer 35 is connected to the input of the active filters 37 and the output of the active filters of the current phase channel 23 are connected to one input of the zero crossing comparator 39 of the current phase channel. The other input of the zero crossing comparator 39 of the current phase channel 15 is connected to ground. The output of the zero crossing comparator 39 of the current phase channel 15 denoted $\phi I$, is connected both to a second sense input of the signal processor 19 and to the interrupt input of the signal processor. The signal processor interrupt is edge sensitive, i.e., an edge transition (preferably a negative to positive transition) causes the signal processor to read its sense inputs and respond in the manner hereinafter described. Further, the $\phi E$ and $\phi I$ signals are of equal priority. That is, a suitable transition of either signal creates an interrupt.

As will be readily appreciated by those skilled in the electronics art from the foregoing discussion, the circuits forming the voltage and current phase channels are similar in nature and are connected together in the same way. These circuits are designed to remove undersirable high frequency components from the signals applied to the inputs of the impedence matching buffers 29 and 35 by the coupling capacitor 25 and the coupling inductor 27, respectively, and square the resulting signals while keeping the phase relationship between the signals coherent. More specifically, the impedence matching buffer 29 of the voltage phase channel 13 has a very high input impedance and produces an output signal whose fluctuations track the voltage fluctuations created across the plates of the coupling capacitor 25 by the voltage fluctuations in a high voltage power line when the L/C coupler 11 is placed suitably close to a high voltage power line conductor. The active filters of the voltage phase channel 13 remove undesirable high frequency components from the resulting signal and the zero crossing comparator 33 converts the resulting sinusoidal signal into a square wave signal. As noted above, this signal is denoted $\phi E$. The impedance matching buffer 35 of the current phase channel 15 has a low impedance input and produces an output signal whose fluctuations track the current fluctuations created in the coil of the coupling inductor 27 by the current fluctuations in a high voltage power line when the L/C coupler 11 is placed suitably close to a high voltage power line conductor. The signal fluctuations are filtered by the active filters 37, which remove any high frequency components therefrom, and the sinusoidal result is squared by the zero crossing comparator 39 of the current channel 15. The result is a square wave signal previously denoted $\phi I$. The phase relationship between the voltage and current signals is maintained, as they are conditioned in the voltage and current phase channels 13 and 15, by forming the voltage and current channel circuits such that corresponding circuits create identical phase shifts. The end result is that the phase angle between the $\phi E$ and $\phi I$ signals is the same as the phase angle between the power line voltage and current fluctuations sensed the coupling capacitor 25 and the coupling inductor 27, respectively.

The true RMS converter 43 converts an alternating current (AC) signal into a DC signal. The magnitude of the DC signal is related to the RMS (root-mean-square) value of the alternating current signal. The input of the true RMS converter 43 is connected to the output of the impedance matching buffer 35 included in the current phase channel 15. Thus, the true RMS converter produces a DC output signal whose magnitude is related to the RMS value of the current signal detected by the coupling inductor 27. The output of the true RMS converter 43 is connected to the analog input of the analogto-digital converter 45. The analog-to-digital converter converts its analog input to a digital output under the control of the signal processor 19. In this regard, as schematically illustrated in FIG. 1, the signal processor 19 produces a START CONVERSION control signal, which is applied to the analog-to-digital converter 45. Preferably, the START CONVERSION control signal is either a pulse or a signal transition. Each time a START CONVERSION control pulse is produced by the signal processor 19 the analog-to-digital converter starts a conversion sequence. When a conversion sequence is complete, the analog-to-digital converter 45 produces a CONVERSION COMPLETE signal. Preferably, the conversion complete signal is either a pulse or a signal transition. In any event, the CONVERSION COMPLETE signal is applied to the signal processor each time the signal processor receives a CONVERSION COMPLETE signal, the signal processor reads the DIGITAL DATA output of the analog-to-digital converter 45.

The signal processor 19 produces DISPLAY CONTROL signals, which are applied to the display 21. Preferably, the display is a numerical display. As will be better understood from the following description, the DISPLAY CONTROL signals can cause the display to show the phase angle between $\phi E$ and $\phi I$, the RMS value of the power line current or the reactive value of the power line current.

Figure 2A:
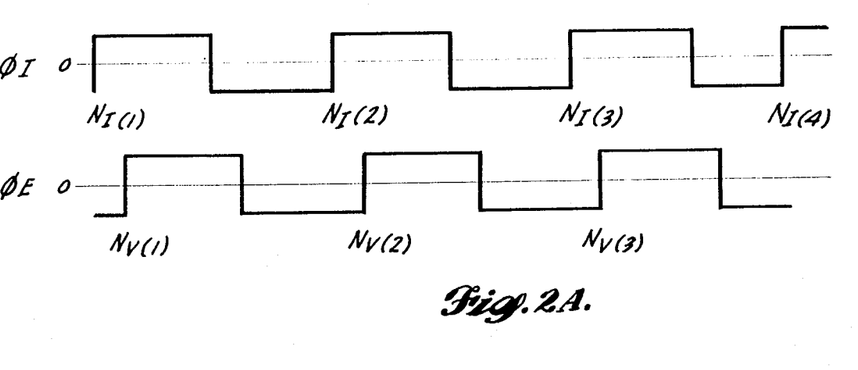
FIGS. 2A and 2B are waveform diagrams illustrating exemplary phase relationships between current and voltage signals after they have passed through the current and voltage phase channels of the embodiment of the invention illustrated in block form in FIG. 1.
Figure 2B:
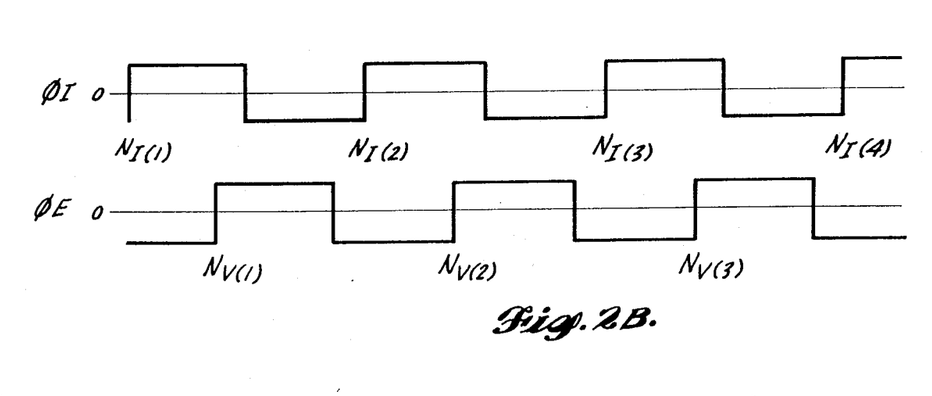

As will be readily appreciated by those skilled in the electronics art from the foregoing description, the invention contemplates producing two square wave signals, denoted $\phi E$ and $\phi I$ and illustrated in FIGS. 2A and 2B, whose phase angle is the same as the phase angle between the power line current and voltage fluctuations. Preferably, the L/C coupler 11, which detects the power line current and voltage fluctuations, is mounted in a housing suitable for mounting on the fitting end of a conventional high voltage power line "hot stick". In this regard, preferably, the housing includes a hook-shaped finger adapted to hang from a power line, generally in the same way current transformerrs have been hung from power lines in the past. The housing and positioning of the coupling capacitor must be such that the coupling capacitor 25 is spaced a known, predetermined distance from the power line conductor when the housing is hung on a power line conductor. Further, the chosen spacing distance must be such that the power line voltage fluctutions cause voltage fluctuations across the plates of the coupling capacitor.

In addition to producing square wave signals that "track" the power line current and voltage fluctuations in a phase related manner, digital data related to the RMS value of the power line current is produced by the preferred embodiment of the invention. The signal processor 19 selectively combines the $\phi E$, $\phi I$ and digital data current signals and selectively produces either a phase angle signal, an RMS current signal or a reactive current signal, in the manner hereinafter described. The resultant signal is applied to the display 21 to create a visual numerical display.

Preferably, the signal processor 19 is microprocessor based. It may take the form of a special purpose microprocessor or a general purpose microprocessor, programmed to function in the manner hereinafter described. In either case, preferably, the signal processor 19 and the clock 47, plus the circuits forming the voltage phase channel 13, the current phase channel 15 and the current conversion channel 17, are all mounted in the same housing that houses the L/C coupler 11. Most preferably, the display 21 is mounted in the same housing. The overall housing structure is mountable atop a "hot stick" as hereinafter described. in such an embodiment of the invention, the display is sized so as to be viewable by a user located at the remote or cold end of the power line hot stick.

Figure 3:
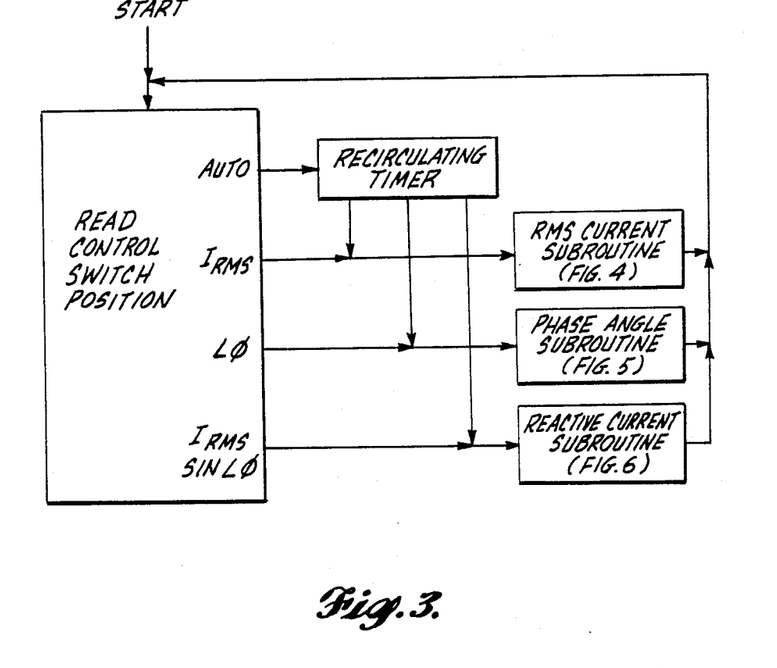
FIG. 3 is a flow diagram illustrating the overall operation of the single processor illustrated in FIG. 1.

As illustrated in FIG. 3, preferably, a high voltage power line phase angle and current measuring instrument formed in accordance with the invention has two main modes of operation. One mode is an automatic mode of operation during which the signal processor cycles through three subroutines on a predetermined interval (e.g., three second) basis. Each of the subroutines determines one of the values described above, e.g., an RMS current value, a phase angle value or a reactive current value. In the other mode of operation, any one of the three values can be selected for continuous display.

FIG. 3 illustrates that the first step in the operation of the signal processor is a read control switch position test. If the control switch is in an automatic (AUTO) position a recirculating timer is started. the recirulating timer has three ouputs. The outputs are such that they are switched from disable to enable states on a sequential time interval basis. The preferred time interval is three (3) seconds. Moreover, only one output is in an enable state at a time. The other two outputs are in a disable state. The enable/disable states of the outputs of the recirculating timer controls which one of the three subroutines that determine the RMS current value, the phase angle value and the reactive current value is to be followed. The chosen subroutine is followed as long as the related output of the recirculating time remains in an enable state, e.g., three (3) seconds.

In addition to the AUTO position, the control switch includes three other positions—an RMS current ($I_{RMS}$) position, a phase angle ($\angle\phi$) position and a reactive current ($I_{RMS}SIN\angle\phi$) position. When the control switch is in the $I_{RMS}$ position, continuous passes are made through the hereinafter described RMS current subroutine. Similarly, when the control switch is in the $\angle\phi$ position, continuous passes are made through the phse angle subroutine and when the control switch is in the $I_{RMS}SIN\angle\phi$ position, continuous passes are made through the reactive current subroutine. As illustrated in FIG. 3, after each pass through any one of the three subroutines, a test of the control switch is made to determine if the control switch position has changed subsequent to the last test of the position of the control switch.

Figure 4:
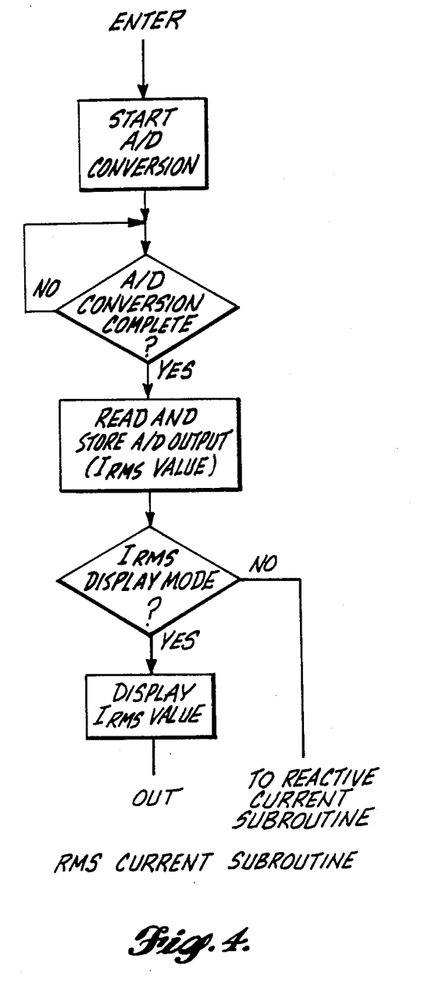
FIG. 4 is a flow diagram of a RMS current subroutine suitable for use in the flow diagram illustrated in FIG. 3.

FIG. 4 is a flow diagram illustrating an RMS current subroutine suitable for use by the signal processor. The first step in the RMS current subroutine is the production of a start analog-to-digital (A/D) conversion pulse or transition illustrated in FIG. 1 as a START CONVERSION command. The START CONVERSION pulse (or transition) starts a cycle of the analog-to-digital (A/D) converter 45. Thereafter, a test is made to determine if a CONVERSION COMPLETE pulse or transition has been produced by the A/D converter. The signal processor continuously cycles through this test until a CONVERSION COMPLETE pulse (or transition) is produced by the analog-to-digital converter 45. When a CONVERSION COMPLETE pulse is detected, the signal processor reads and stores the DIGITAL DATA output. of the A/D converter. As previously noted, the value of this digital signal is related to the RMS value of power line current fluctuations. Next, a test is made to determine if the signal processor is in an $I_{RMS}$ display mode of operation. In this regard, as will be better understood from the following description of the reactive current subroutine, in addition to the state of the control switch or the recirculating timer causing a pass to be made through the RMS subroutine, a pass is made through the RMS current subroutine during a pass through the reactive current subroutine. However, when a pass is made through the RMS current subroutine during a pass through the reactive current subroutine, the RMS current value is not displayed. The $I_{RMS}$ display mode test is included to determine how the RMS subroutine was entered. If the $I_{RMS}$ display mode test is negative (meaning that the RMS current subroutine was entered from the reactive subroutine and, thus, the RMS current value is not to be displayed), the RMS current subroutine ends and the sequence of operation of the signal processor returns to the reactive current subroutine hereinafter described. If the $I_{RMS}$ display mode test is positive, the $I_{RMS}$ value is displayed, the RMS current subroutine ends and the sequence of operation of the signal processor shifts to the read control switch position test illustrated in FIG. 3 and herretofore described.

Figure 5:
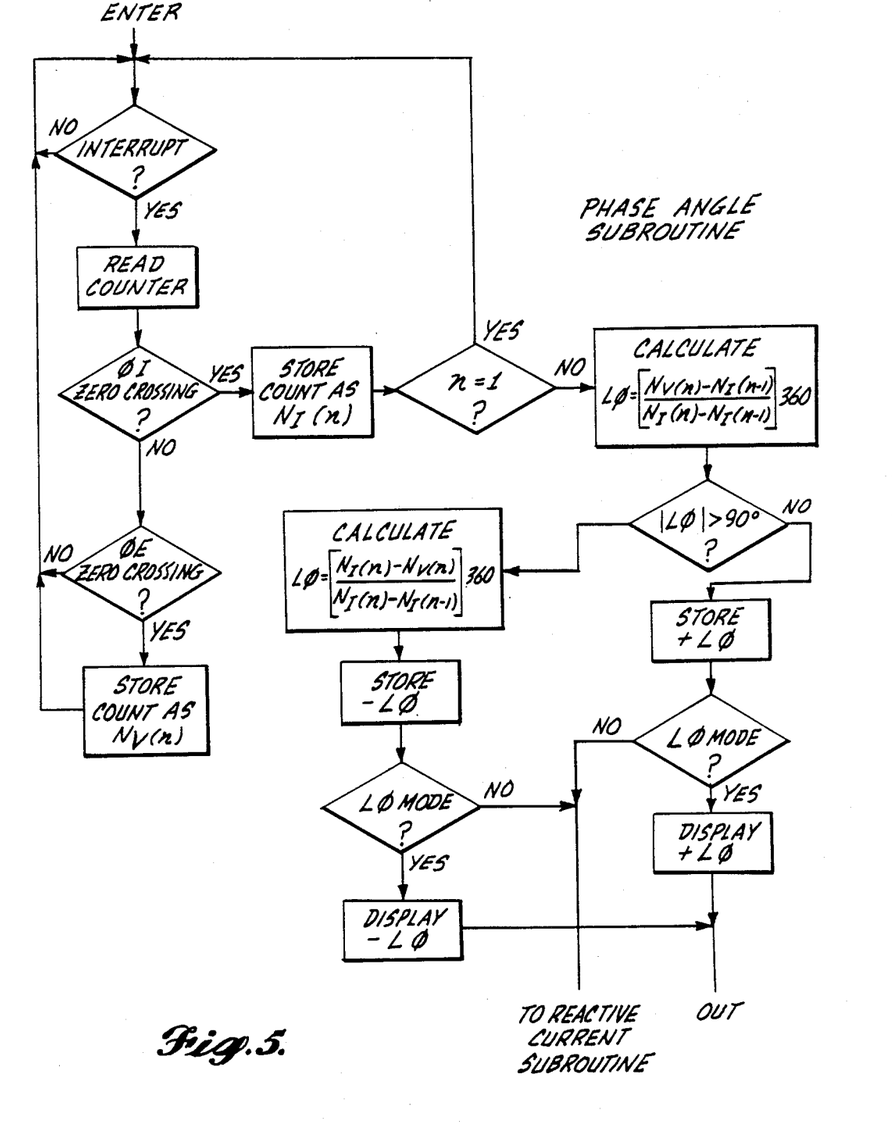
FIG. 5 is a flow diagram of a phase angle subroutine suitable for use in the flow diagram illustrated in FIG. 3; and, FIG. 6 is a flow diagram of reactive current subroutine suitable for use in the flow diagram illustrated in FIG. 3.

FIG. 5 is a flow diagram illustrating a phase angle subroutine suitable for use by the signal processor. The first step after the phase angle subroutine has been entered is to determine whether or not an interrupt has occurred on the interrupt input of the signal processor 19. In this regard, as noted above, preferably the interrupt input of the signal processor is edge transition sensitive. As will be readily appreciated by those familiar with microprocesors, edge transition sensitive microprocessors can respond to either rising or falling edges, depending upon the particular type of microprocessor and/or how it is programmed. By way of example, as illustrated in FIGS. 2A and 2B, the interrupt input of the signal processor of the embodiment of the invention being described is chosen to respond to negative to positive signal transitions. Moreover, as also noted above, the $\phi E$ and $\phi I$ signals are of equal priority, i.e., a negative to positive transition on either signal creates an interrupt.

Returning now to the flow diagram of the phase angle subroutine illustrated in FIG. 5, the interrupt test is repeated after the phase angle subroutine is entered until an interrupt is detected. When an interrupt is detected, the value stored in a counter is read. In this regard, the signal procesor 19 includes a free running counter that counts pulses produced by a suitable source, such as the clock 47. During a pass through the phase angle subroutine the counter is read and the value stored as either a current count value ($N_I$) or a voltage count value ($N_V$), as described below and illustrated in FIG. 5.

After the counter is read, a test is made to determine whether or not the interrupt was caused by a zero crossing of the $\phi I$ signal. This is determined by testing the $\phi I$ signal applied to the signal processor 19. If the interrupt was not created by a zero crossing of the $\phi I$ signal, a test is made to determine whether or not the interrupt was caused by a zero crossing of the $\phi E$ signal. If the interrupt was not caused by a zero crossing of the $\phi E$ signal, the phase angle subroutine cycles back to the interrupt test, since the interrupt was apparently in error. If the interrupt was caused by a zero crossing of the $\phi E$ signal, the counter value is stored and the count value designated $N_{V(n)}$. This nomenclature indicates that the value is a count value (N) related to the voltage (V). The (n) portion of the subscript denotes the next value in a series of values, i.e., one, two, three, etc.

If the $\phi I$ zero crossing test determines that the interrupt was caused by a zero crossing of the $\phi I$ signal, the counter value is stored and the count value of n is equal to 1. This test is required because the formulas that are used to calculate the phase angle value (set forth below) require two current count values. As a result, if n is equal 1 (meaning that this is the first current count value and, thus, inadequate data exists to calculate the phase angle), the phase angle subroutine returns to the point whereat the interrupt test is performed.

If the n=1 test is negative (meaning that n is 2 or greater), the phase angle is determined based on the following formula:

$$\angle \phi = \left[ \frac{N_{V(n)} - N_{I(n-1)}}{N_{I(n)} - N_{I(n-1)}} \right] 360 \qquad (1)$$

$N_{I(n-1)}$ is of course, the preceeding value of $N_{I(n)}$.

After the phase angle has been determined in accordance with Equation (1), a test is made to determine whether or not the absolute value of the phase angle, $|\angle \phi|$, is greater than 90°. If the absolute value of the phase angle is less than 90°, the value of the phase angle determined by Equation (1) is stored as a positive or leading phase angle. Thereafter, a test is made to determine whether or not the pass through the phase angle subroutine was entered during a pass through the hereinafter described reactive current subroutine, or whether the phase angle subroutine was entered because of the position of the control switch or the state of the output of the recirculating timer. This test, denoted the $\angle \phi$ mode test, is required because the phase angle value is not displayed when a pass through the phase angle subroutine is performed as part of a pass through the hereinafter described reactive current subroutine. The phase angle value is only displayed when a pass through the phase angle subroutine is caused by the control switch being in the $\angle \phi$ state or by the recirculating timer output enabling the phase angle subroutine, as theretofore described. If the $\angle \phi$ mode test is negative (meaning that the pass through the phase angle subroutine is part of a pass through the reactive current subroutine), the phase angle subroutine ends and the operation of the signal processor returns to the hereinafter described reactive current subroutine. If the $\angle \phi$ mode test is positive, phase angle value is applied to the display 21 and displayed as a leading (+) phase angle.

If the absolute value of the phase angle, $|\angle \phi|$, test determines that the phase angle is greater than 90° after the Equation (1) steps are carried out, a new value of phase angle is calculated in accordance with the following equation:

$$\angle \phi = \left[ \frac{N_{I(n)} - N_{V(n)}}{N_{I(n)} - N_{I(n-1)}} \right] 360 \qquad (2)$$

Thereafter the phase angle value is stored as a minus (−) or lagging phase angle. Then, a test is made to determine whether or not the signal processor is in a $\angle \phi$ mode of operation, i.e., a test is made to determine if the pass through phase angle subroutine is part of a pass through the reactive subroutine or occurred because of the position of the control switch or the state of the output of the recirculating timer. If the signal processor is not in a $\angle\phi$ mode of operation, the phase angle subroutine ends and the operation of the signal processor returns to the reactive current subroutine. If the signal processor is in a $\angle\phi$ mode of operation, the last determined value of phase angle is displayed as a lagging (−) phase angle.

As will be readily appreciated by those skilled in the art and others from the foregoing description and reviewing FIG. 5, the phase angle subroutine determines whether or not the phase angle between the current and voltage is a leading or lagging phase angle and the magnitude of the phase angle. A phase angle limit of 90° is placed on the relationship between the current and voltage phases because a phase angle greater than 90° cannot occur between power line current and voltage fluctuations. An exemplary situation wherein the current ($\phi I$) leads the voltage ($\phi E$) by some value less than 90°, specifically 45°, is illustrated in FIG. 2A. An exemplary situation where the current ($\phi I$) lags the voltage ($\phi E$) by some value less than 90°, namely 45°, is illustrated in FIG. 2B.

As will be readily appreciated by those skilled in the art and others, the phase angle subroutine illustrated in FIG. 5 has been simplified for ease of description purposes. In this regard, other tests and steps that will be obvious to skilled microprocessor programmers will be required in an actual embodiment of the invention. For example, since it is necessary that the $N_{V(n)}$ value lie between the $N_{I(n-1)}$ and $N_{I(n)}$ values, a test is required to determine whether or not the first interrupt that causes a value of the counter to be read and stored is caused by a zero crossing of the $\phi I$ signal. If the first interrupt is caused by a zero crossing of the $\phi E$ signal, the test would require the count value be ignored. Further provisions for resetting the counter (or determining when its maximum count value has been passed and the new counter value is lower than the last counter value) will be required.

Figure 6:
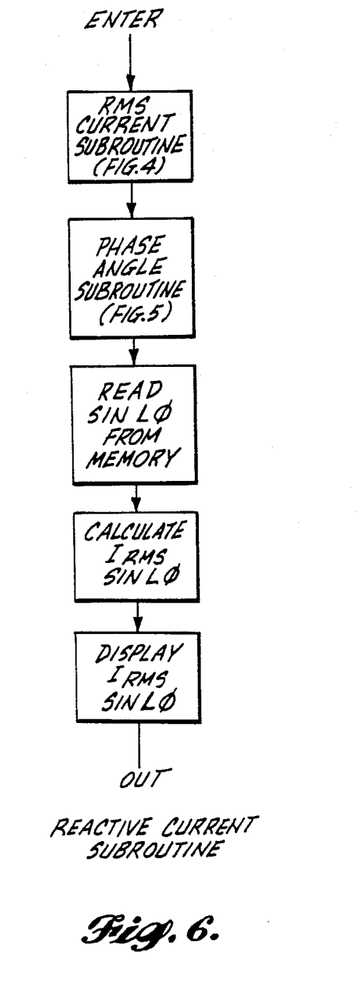

FIG. 6 is a flow diagram of a reactive current subroutine. The first step of the reactive current subroutine is a pass through the RMS current subroutine illustrated in FIG. 4. As a result, the RMS value of the current is determined and stored. As described above, when a pass is made through the RMS current subroutine as part of a pass through the reactive current subroutine, the RMS current value is determined, but not displayed. Rather, the signal processor returns to the reactive current subroutine after the RMS current value is determined. Next, a pass through the phase angle subroutine illustrated in FIG. 5 is made. As a result, the phase angle between the current and voltage is determined. At the end of the phase angle subroutine, the signal processor returns to the reactive current subroutine as also described above. At this point, both the RMS current value and the phase angle value have been determined. Thereafter, the signal processor reads from its memory the value of the sine of the phase angle determined during the pass through the phase angle subroutine. As will be readily understood by those skilled in the microprocessor art, sine values taken from a conventional table can be stored in the suitable memory, such as a read only memory (ROM). The sine value addresses can be based on the phase angle values determined during passes through the phase angle subroutine. Rounding off and/or interpolation can be utilized, as required. In any event, after the value of the sine of the phase angle has been read from memory, this value is multiplied by the RMS current value determined during the pass through the RMS current subroutine. The result of this calculation ($I_{RMS}SIN\angle\phi$) is the reactive current value, which is applied to the display 21.

As will be readily appreciated from the foregoing description, the invention provides a high voltage power line phase angle and current measuring instrument. If desired, obviously, the invention can be implemented such that only a phase angle measuring instrument is provided. However, additional versatility is provided by including the ability to determine the RMS value of the power line current and/or the reactive current value. Preferably, the invention is implemented in a form that is mountable on the end of a hot stick. Contrary to prior art devices, hot stick connection to only a single power line is required, as opposed to a connection to two power lines, as is the case with the instrument described in U.S. Pat. No. 4,316,254.

While a preferred embodiment of the invention has been illustrated and described, it will be appreciated that various changes can be made therein without departing from the spirit and scope of the invention. For example, the sequence of the operation of the various subroutines illustrated in FIGS. 4–6 can be modified in a wide variety of manners that will be readily apparent to those skilled in the microprocessor art. Moreover, various types of signal processors can be utilized which may receive information in different forms. For example, rather than a signal processor that has an edge sensitive interrupt input, the signal processor could be pulse or signal level interruptible. Further, a wide vairety of buffer amplifiers, active filters and zero crossing comparators can be utilized as long as the phase channels 13 and 15 is maintained constant. Consequently, the invention can be practiced otherwise than as specifically described herein.

The embodiments of the invention in which an exclusive property or privilege is claimed are defined as follows:

1. A high voltage power line phase angle measuring instrument comprising:
   an L/C coupler, including a coupling capacitor and a coupling inductor suitable for producing voltage and current signals whose fluctuations track the voltage and current fluctuations of the power carried by a high voltage power line when said L/C coupler is positioned suitably close to, but spaced from, a single power line;
   a voltage channel connected to said coupling capacitor of said L/C coupler for: receiving said voltage signal, filtering said voltage signal to remove undesirable components therefrom, and squaring said filtered voltage signal to produce a square wave voltage signal that tracks said voltage fluctuations of the power carried by said high voltage power line;
   a current channel connected to said coupling inductor of said L/C coupler for: receiving said current signal, filtering said current signal to remove undersirable components therefrom, and squaring said filtered current signal to produce a square wave current signal that tracks said current fluctuations of the power carried by said high voltage power line, the circuits included in said voltage and current channels being formed such that the phase shift produced in said channels as the voltage and current signals are filtered and squared is substantially identical whereby the phase angle between said square wave voltage and current signals is the same as the phase angle between the voltage and current fluctuations of the power carried by said voltage power line;

a signal processor connected to said voltage and current channels for receiving said square wave voltage and current signals and determining the phase angle between said voltage and current signals based on the time between transitions of said square wave voltage and current signals; and, a display connected to said signal processor for displaying the phase angle determined by said signal processor.

2. A high voltage power line phase angle measuring instrument as claimed in claim 1 wherein said coupling capacitor is a center tapped coupling capacitor and wherein said coupling inductor is a center tapped coupling inductor, the center taps of said coupling capacitor and said coupling inductor being connected to a source of constant potential.

3. A high voltage power line phase angle measuring instrument as claimed in claim 1 wherein:
(A) said voltage channel includes:
   (1) an impedence matching buffer having its input connected across said coupling capacitor;
   (2) filter means connected to said impedance matching buffer for filtering the output of said impedance matching buffer; and,
   (3) a zero crossing comparator connected to the output of said filter means for squaring the output of said filter means to produce said square wave voltage signal; and
(B) said current channel comprises:
   (1) an impedance matching buffer having its input connected across said coupling inductor;
   (2) filter means connected to the output of said impedance matching buffer; and,
   (3) a zero crossing comparator connected to the output of said filter means for squaring the output of said filter means to produce said square wave current signal.

4. A high voltage power line phase angle measuring instrument as claimed in claim 3 wherein said coupling capacitor is a center tapped coupling capacitor and wherein said coupling inductor is a center tapped coupling inductor, the center taps of said coupling capacitor and said coupling inductor being connected to a source of constant potential.

5. A high voltage power line phase angle measuring instrument as claimed in claim 3 wherein said signal processor includes sense inputs for receiving said square wave voltage and current signals and an interrupt input also connected to receive said square wave current and voltage signals, said interrupt input being responsive to a transition in a predetermined direction of either of said square wave voltage or current signals.

6. A high voltage power line phase angle measuring instrument as claimed in claim 5 wherein said coupling capacitor is a center tapped coupling capacitor and wherein said coupling inductor is a center tapped coupling inductor, the center taps of said coupling capacitor and said coupling inductor being connected to a source of constant potential.

7. A high voltage power line phase angle measuring instrument as claimed in claim 5 wherein said signal processor determines said phase angle by measuring the ratio (a) of the time between a transition in a predetermined direction of one of said square wave current and voltage signals and a transition in the same direction of the other of said square wave voltage and current signals; and, (b) the time between the transition in said one direction of said one of said voltage and current signals and the subsequent transition in the same direction of said one of said current and voltage signals.

8. A high voltage power line phase angle measuring instrument as claimed in claim 7 wherein said coupling capacitor is a center tapped coupling capacitor and wherein said coupling inductor is a center tapped coupling inductor, the center taps of said coupling capacitor and said coupling inductor being connected to a source of constant potential.

9. A high voltage power line phase angle measuring instrument as claimed in claim 7 wherein said ratio is multiplied by 360 to determine the value of said phase angle in degrees.

10. A high voltage power line phase angle measuring instrument as claimed in claim 9 wherein said coupling capacitor is a center tapped coupling capacitor and wherein said coupling inductor is a center tapped coupling inductor, the center taps of said coupling capacitor and said coupling inductor being connected to a source of constant potential.

11. A high voltage power line phase angle measuring instrument as claimed in claim 1 wherein said signal processor includes sense inputs for receiving said square wave voltage and current signals and an interrupt input also connected to receive said square wave current and voltage signals, said interrupt input being responsive to a transition in a predetermined direction of either of said square wave voltage or current signals.

12. A high voltage power line phase angle measuring instrument as claimed in claim 11 wherein said coupling capacitor is a center tapped coupling capacitor and wherein said coupling inductor is a center tapped coupling inductor, the center taps of said coupling capacitor and said coupling inductor being connected to a source of constant potential.

13. A high voltage power line phase angle measuring instrument as claimed in claim 11 wherein said signal processor determines said phase angle by measuring the ratio (a) of the time between a transition in a predetermined direction of one of said square wave current and voltage signals and a transition in the same direction of the other of said square wave voltage and current signals; and, (b) the time between the transition in said one direction of said one of said voltage and current signals and the subsequent transition in the same direction of said one of said current and voltage signals.

14. A high voltage power line phase angle measuring instrument as claimed in claim 13 wherein said coupling capacitor is a center tapped coupling capacitor and wherein said coupling inductor is a center tapped coupling inductor, the center taps of said coupling capacitor and said coupling inductor being connected to a source of constant potential.

15. A high voltage power line phase angle measuring instrument as claimed in claim 13 wherein said ratio is multiplied by 360 to determine the value of said phase angle in degrees.

16. A high voltage power line phase angle measuring instrument as claimed in claim 15 wherein said coupling capacitor is a center tapped coupling capacitor and wherein said coupling inductor is a center tapped coupling inductor, the center taps of said coupling capacitor and said coupling inductor being connected to a source of constant potential.

17. A high voltage power line phase angle measuring instrument as claimed in claim 1 wherein said signal processor determines said phase angle by measuring the ratio (a) of the time between a transition in a predetermined direction of one of said square wave current and voltage signals and a transition in the same direction of the other of said square wave voltage and current signals; and, (b) the time between the transition in said one direction of said one of said voltage and current signals and the subsequent transition in the same direction of said one of said current and voltage signals.

18. A high voltage power line phase angle measuring instrument as claimed in claim 17 wherein said coupling capacitor is a center tapped coupling capacitor and wherein said coupling inductor is a center tapped coupling inductor, the center taps of said coupling capacitor and said coupling inductor being connected to a source of constant potential.

19. A high voltage power line phase angle measuring instrument as claimed in claim 17 wherein said ratio is multiplied by 360 to determine the value of said phase angle in degrees.

20. A high voltage power line phase angle measuring instrument as claimed in claim 19 wherein said coupling capacitor is a center tapped coupling capacitor and wherein said coupling inductor is a center tapped coupling inductor, the center taps of said coupling capacitor and said coupling inductor being connected to a source of constant potential.

21. A high voltage power line phase angle and current measuring instrument comprising:
   an L/C coupler, including a coupling capacitor and a coupling conductor suitable for producing voltage and current signals whose fluctuations track the voltage and current fluctuations of the power carried by a power line when said L/C coupler is positioned suitably close to, but spaced from, a single power line;
   a voltage channel connected to said coupling capacitor of said L/C coupler for: receiving said voltage signal, filtering said voltage signal to remove undesirable components therefrom, and squaring said filtered voltage signal to produce a square wave voltage signal that tracks said voltage fluctuations of said power carried by said high voltage power line;
   a current channel connected to said coupling inductor of said L/C coupler for: receiving said current signal, filtering said current signal to remove undesirable components therefrom and squaring said filtered current signal to produce a square wave current signal that tracks said current fluctuations of said power carried by said high voltage power line, the circuits included in said voltage and current channels being formed such that the phase shift produced in said channels as the voltage and current signals are filtered and squared is substantially identical whereby the phase angle between said square wave voltage and current signals is the same as the phase angle between the voltage and current fluctuations of the power carried by said high voltage power line;
   a current conversion channel connected to said current channel to receive said current signal and convert said fluctuating current signal into a DC signal whose magnitude tracks the RMS value of said current signal;
   a signal processor connected to said voltage channel, said current channel and said current conversion channel for: receiving said square wave voltage and current signals and said RMS current signal, determining the phase angle between said voltage and current signals based on the time between the transitions of said square wave voltage and current signals, and producing display control signals representing either the phase angle between said voltage and current signal or said RMS current value; and,
   a display connected to said signal processor for selectively displaying either said phase angle value or said RMS current value 22. A high voltage power line phase angle and current measuring instrument as claimed in Claim 21 wherein said coupling capacitor is a center tapped coupling capacitor and wherein said coupling inductor is a center tapped coupling inductor, the center taps of said capacitor and said coupling inductor being connected to a source of constant potential.

23. A high voltage power line phase angle and current measuring instrument as claimed in claim 21 wherein:
   (A) said voltage channel includes;
      (1) an impedence matching buffer having its input connected across said coupling capacitor;
      (2) filter means connected to said impedence matching buffer for filtering the output of said impedence matching buffer; and,
      (3) a zero crossing comparator connected to the output of said filter means for squaring the output of said filter means to produce said square wave voltage signal; and,
   (B) said current channel comprises:
      (1) an impedence matching buffer having its input connected across said coupling inductor;
      (2) filter means connected to the output of said impedence matching buffer; and
      (3) a zero crossing comparator connected to the output of said filter means for squaring the output of said filter means to produce said square wave current signal.

24. A high voltage power line phase angle and current measuring instrument as claimed in claim 23 wherein said signal processor includes sense inputs for receiving said square wave voltage and current signals and an interrupt input also connected to receive said square wave current and voltage signals, said interrupt input being responsive to a transition in a predetermined direction of either of said square wave voltage or current signals.

25. A high voltage power line phase angle and current measuring instrument as claimed in claim 24 where said signal processor determines said phase angle by measuring the ratio (a) of the time between a transition in a predetermined direction of one of said square wave current and voltage signals and transition in the same direction of the other of said square wave voltage and current signals; and (b) the time between the transition in said one direction of said one of said voltage and current signals and the subsequent transition in the same direction of said one of said current and voltage signals.

26. A high voltage power line phase angle and current measuring instrument as claimed in claim 25 wherein said ratio is multiplied by 360 to determine the value of said phase angle in degrees.

27. A high voltage power line phase angle and current measuring instrument as claimed in claim 26 wherein said current conversion channel includes a true RMS converter for converting said alternating current signal to said DC signal whose magnitude represents the RMS value of said alternating current signal and an analog-to-digital converter for converting said DC signal into a digital RMS signal.

28. A high voltage power line phase angle and current measuring instrument as claimed in claim 27 wherein said signal processor also determines the reactive current value of the power carried by said power line by multiplying the sine of said phase angle value by said RMS current value and wherein said display also selectively displays said reactive current value.

29. A high voltage power line phase angle and current measuring instrument as claimed in claim 21 where said signal processor determines said phase angle by measuring the ratio (a) of the time between a transition in a predetermined direction of one of said square wave current and voltage signals and transition in the same direction of the other of said square wave voltage and current signals; and (b) the time between the transition in said one direction of said one of said voltage and current signals and the subsequent transition in the same direction of said one of said current and voltage signals.

30. A high voltage power line phase angle and current measuring instrument as claimed in claim 29 wherein said ratio is multiplied by 360 to determine the value of said phase angle in degrees.

31. A high voltage power line phase angle and current measuring instrument as claimed in claim 30 wherein said signal processor also determines the reactive current value of the power carried by said power line by multiplying the sine of said phase angle value by said RMS current value and wherein said display also selectively displays said reactive current value.

32. A high voltage power line phase angle and current measuring instrument as claimed in claim 21 wherein said current channel includes a true RMS converter for converting said alternating current signal to said DC signal whose magnitude represents the RMS value of said alternating current signal and an analog-to-digital converter for converting said DC signal into a digital RMS signal.

33. A high voltage power line phase angle and current measuring instrument as claimed in claim 21 wherein said signal processor also determines the reactive current value of the power carried by said power line by multiplying the sine of said phase angle value by said RMS current value and wherein said display also selectively displays said reactive current value.

* * * * *

UNITED STATES PATENT AND TRADEMARK OFFICE
CERTIFICATE OF CORRECTION

PATENT NO. : 4,492,918

DATED : January 8, 1985

INVENTOR(S) : Hernandez et al.

It is certified that error appears in the above-identified patent and that said Letters Patent is hereby corrected as shown below:

Column 1, line 7: after "to" insert --high--
Column 2, line 4: "compound" should be --company--
line 45: "of" should be --by--
Column 8, line 7: after "value" (second occurrence) insert --designated $N_{I(n)}$. Thereafter a test is made to determine whether or not the value--
line 11: after "equal" insert --to--
Column 10, line 35: after "phase" insert --relationship between the signals passing through the voltage and current phase--
Column 11, line 6: after "said" insert --high--

Signed and Sealed this

Thirty-first Day of December 1985

[SEAL]

Attest:

DONALD J. QUIGG

Attesting Officer

Commissioner of Patents and Trademarks